(12) United States Patent
Oshino

(10) Patent No.: US 6,816,568 B2
(45) Date of Patent: Nov. 9, 2004

(54) X-RAY PROJECTION EXPOSURE DEVICE, X-RAY PROJECTION EXPOSURE METHOD, AND SEMICONDUCTOR DEVICE

(75) Inventor: Tetsuya Oshino, Tokyo (JP)

(73) Assignee: Nikon Corporation, Tokyo (JP)

( * ) Notice: Subject to any disclaimer, the term of this patent is extended or adjusted under 35 U.S.C. 154(b) by 101 days.

(21) Appl. No.: 10/182,855

(22) PCT Filed: Dec. 5, 2001

(86) PCT No.: PCT/JP01/10615
§ 371 (c)(1),
(2), (4) Date: Aug. 2, 2002

(87) PCT Pub. No.: WO02/47132
PCT Pub. Date: Jun. 13, 2002

(65) Prior Publication Data
US 2003/0179849 A1 Sep. 25, 2003

(30) Foreign Application Priority Data
Dec. 6, 2000 (JP) .................................. 2000-371052

(51) Int. Cl.[7] .................................................. G21K 5/00
(52) U.S. Cl. .......................... 378/34; 378/205; 378/206
(58) Field of Search ..................... 378/34, 205, 206; 250/548; 355/53

(56) References Cited

U.S. PATENT DOCUMENTS

| | | | |
|---|---|---|---|
| 5,243,195 A | 9/1993 | Nishi | 250/548 |
| 5,448,332 A | 9/1995 | Sakakibara et al. | 355/53 |
| 6,118,515 A | 9/2000 | Wakamoto et al. | 355/53 |
| 6,240,158 B1 * | 5/2001 | Oshino | 378/34 |
| 6,341,007 B1 | 1/2002 | Nishi et al. | 355/53 |
| 2002/0017616 A1 | 2/2002 | Ota | 250/492.1 |

FOREIGN PATENT DOCUMENTS

JP  10-357005  12/1998

* cited by examiner

Primary Examiner—Craig E. Church
Assistant Examiner—Courtney Thomas
(74) Attorney, Agent, or Firm—Klarquist Sparkman, LLP (57) ABSTRACT

X-ray projection-exposure apparatus are disclosed that achieve a higher accuracy of pattern overlay than conventionally. An embodiment of such an apparatus includes an X-ray source, an illumination-optical system for irradiating an X-ray beam from the X-ray source onto a mask defining a pattern, a mask stage for holding the mask, a projection-optical system for directing the patterned beam from the mask to project an image of the pattern onto a resist-coated wafer, a wafer stage for holding the wafer, and a mark-position-detection system for detecting the position of a mark formed on the wafer. The center of an exposure-image field of the projection-optical system is located at a position displaced from the center axis of the projection-optical system, and the center axis of the mark-position-detection system is located laterally adjacent the exposure-image field with respect to the center axis of the projection-optical system.

11 Claims, 6 Drawing Sheets

X-RAY PROJECTION EXPOSURE DEVICE, X-RAY PROJECTION EXPOSURE METHOD, AND SEMICONDUCTOR DEVICE

CROSS REFERENCE TO RELATED APPLICATIONS

This is the U.S. National Stage of International Application No. PCT/JP01/10615, filed Dec. 5, 2001, which was published under PCT Article 21(2), which in turn claims the benefit of Japan Patent Application No. 2000-371052 filed Dec. 6, 2000. All these applications are incorporated herein in their entirety.

FIELD

This disclosure pertains, inter alia, to X-ray projection-exposure ("microlithography") apparatus for transferring, for instance, circuit patterns defined on a photomask (either a mask or a reticle) onto a substrate such as a semiconductor wafer. The X-ray projection-exposure apparatus employ an X-ray beam having a wavelength in the range of 1 to 30 nm that transfers the pattern by passing through a reflection-type imaging-optical system. This disclosure also pertains to exposure methods performed using such an X-ray projection-exposure apparatus, and to semiconductor devices manufactured using the X-ray projection-exposure apparatus.

BACKGROUND

Exposure apparatus used for manufacturing semiconductor devices are typically configured to project, and thus "transfer," a circuit pattern, defined on a mask or reticle (termed a "mask" herein), via a projection-optical system onto a suitable substrate such as a semiconductor wafer. During projection-exposure the mask is situated at an object plane and the substrate is situated at an image plane. In most projection-exposure apparatus currently in use (that utilize light in the deep-UV range), both the mask and the optical elements of the projection-optical system are transmissive to the light used for performing pattern transfer, and hence are termed "transmissive" optical systems. For example, a projection-exposure apparatus still currently in wide use utilizes, as an exposure-light source, "i-line" light produced by a high-pressure mercury lamp. Other deep-UV projection-exposure apparatus utilize, for example, a KrF excimer laser as a source of exposure light.

Figure 5:
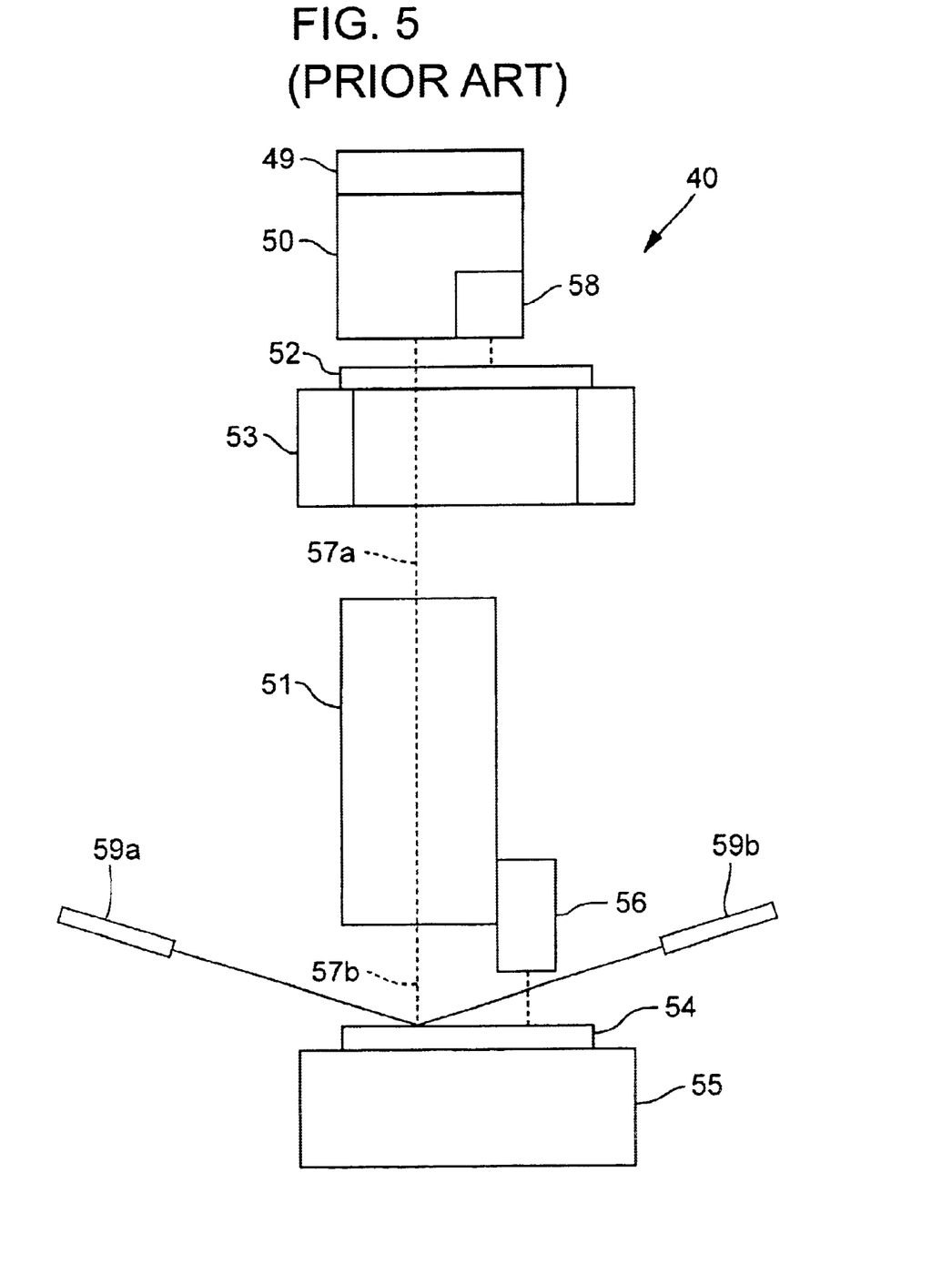
FIG. 5 is a conceptual diagram that elevationally depicts a conventional deep-UV projection-exposure apparatus.

A conventional transmissive optical system 40 is depicted conceptually in FIG. 5. The depicted apparatus includes a light source 49, an illumination-optical system 50, a projection-optical system 51, a mask stage 53 for holding a mask 52, a wafer stage 55 for holding a wafer 54, a detection system 56 for detecting alignment marks on the wafer 54, and a detection system 58 for detecting alignment marks on the mask 52. A light beam, used for pattern transfer, downstream of the mask 52 is denoted as item 57a, and downstream of the projection-optical system 51 is denoted as item 57b. In FIG. 5 the beam 57a, 57b is shown propagating along the optical axis of the projection-optical system 51.

The apparatus 40 of FIG. 5 also includes an optically based system 59a, 59b for detecting the surface position of the wafer 54. The surface-position-detection system includes a light source 59a that obliquely illuminates a light beam onto the surface of the wafer 54. Light of the beam reflected from the wafer 54 is detected by a photodetector 59b. Thus, the position of the wafer surface, in a direction along the optical axis, is detected. Examples of surface-position-detection systems of this type are described in Japan laid-open (Kôkai) Patent Application No. Hei 6-283403, Japan Kôkai Patent Application No. Hei 8-64506, and Japan Kôkai Patent Application No. Hei 10-214783. Such a detection system also may be used for detecting positions of a mark formed on the wafer and/or positions of a mark formed on the mask 52.

The pattern defined on the mask 52 can be configured for projection, by the projection-optical system 51, onto the wafer 54 at unity magnification or with demagnification. Demagnification is characterized by the image on the wafer being smaller, by a demagnification factor established by the projection-optical system 51, than the corresponding pattern on the mask 52.

The projection-optical system 51 normally comprises multiple lenses or the like that collectively function to form an image of the mask pattern on the surface of the wafer 54. The entire mask pattern can be exposed in one exposure "shot," or may require multiple exposure shots, depending upon the optical field (exposure-image field) of the projection-optical system 51 relative to the size of the pattern as projected onto the wafer. For example, if the projection-optical system 51 has an optical field of 20-mm square, then a die (or multiple dies) having a total area of no greater than 20-mm square can be exposed on one shot.

On the surface of the wafer 54, patterns for microcircuits are projected and formed layer-by-layer in a superposed manner. Exposure and formation of the requisite number of layers results in formation of a micro-electronic device in which the layers are interconnected with each other in a three-dimensional manner. These layers must be formed in a manner requiring extremely accurate registration ("overlay") of each new layer with existing layers formed in previous exposures. To achieve high overlay accuracy, the apparatus 40 of FIG. 5 typically also includes respective devices for detecting the positions of the mask 52 and wafer 54 as exposures are being made. Each device normally includes a respective interferometer and the respective mark-position-detection system 58, 56. As the interferometers measure the respective positions of the mask stage 53 and wafer stage 55 in real time, the mark-position-detection systems 58, 56 optically detect respective alignment marks defined on the wafer 54 and the mask 52.

For example, the mark-position-detection system 56 can be configured as an optical microscope that produces a magnified image of the detected mark on the wafer 54. The system 56 includes an image detector, such as a charge-coupled device (CCD), for detecting the magnified image. In many conventional apparatus, the mark-position-detection system 56 is mounted laterally adjacent the projection-optical system 51 due to space constraints. An example of such a mark-position-detection system is disclosed in Japan Kôkai Patent Application No. Hei 5-21314.

Figure 6:
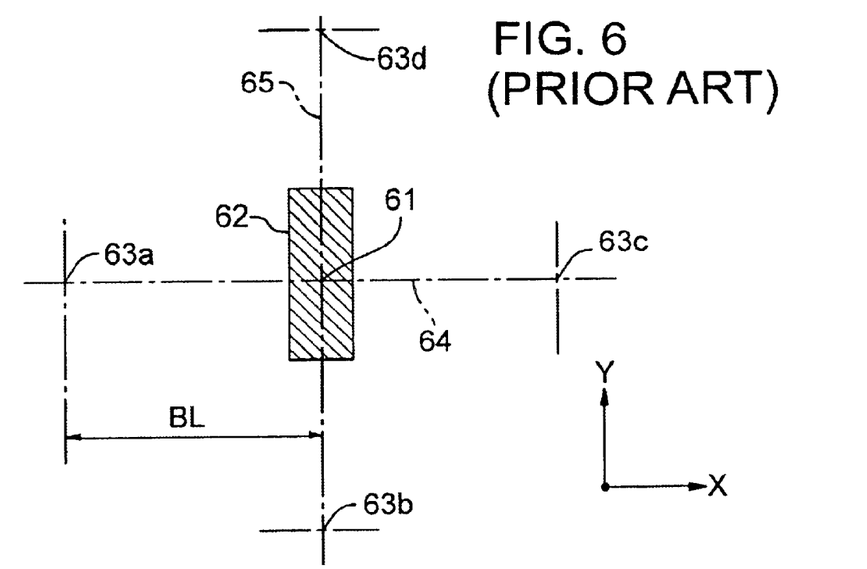
FIG. 6 depicts, in plan view, certain positional relationships between an exposure-image field and the detection center of the mark-position-detection system of the conventional projection-exposure apparatus of FIG. 5.

FIG. 6 depicts a representative relationship, at the image plane, between the optical field (exposure-image field) of the projection-optical system 51 and "detection centers" associated with the mark-position-detection system 56. The hatched area in the center of the figure corresponds to the exposure-image field 62, which has a center 61. In this example, the exposure-image field 62 is rectangular. A straight line 64 denoted by a dot-dash line extends laterally from the center 61 in the X-direction. The wafer stage 55 is configured to move the wafer 54 in directions parallel to the line 64. Another straight line 65, denoted by a dot-dash line, extends vertically in the Y-direction (at a right angle to the line 64) from the point 61.

In a conventional projection-exposure apparatus, the central axis (i.e., the optical axis) of the projection-optical system 51 typically passes (in a Z-direction) through the center 61 of the exposure-image field 62. The reason for this configuration is that the optical elements (lenses and/or mirrors) of the projection-optical system 51 typically are axially symmetrical in shape and situated along the optical axis, and the exposure light passing through the projection-optical system 51 is kept at or close to the optical axis to minimize optical aberrations. As a result, the exposure-image field on the image plane typically is located near the optical axis.

In instances in which the mark-position-detection system 56 (FIG. 5) is optical in configuration, the detection center 63 usually is situated at a position that is separated from the center point 61 of the exposure-image field 62. The distance between these points 61, 63 is a defined distance denoted by "BL" in the figure. Establishing the distance BL prevents the mark-position-detection system 56 from interfering with the projection-optical system 51. In this regard, the detection center 63 denotes the intersection of the optical axis of the mark-position-detection system 56 with the image (wafer) plane. In this instance, the distance BL is essentially equal to a dimension that is the sum of the radius of the optical column of the projection-optical system 51 and the radius of the optical column of the mark-position-detection system 56. Assuming that the wafer stage 55 is configured to move along an X-direction drive axis that is parallel to the line 64 and to move along a Y-direction drive axis that is parallel to the line 65, the detection center 63 can be situated at any of four positions 63a, 63b, 63c, 63d. The positions 63a, 63care located on the line 64 and separated by respective distances BL from the center 61 of the projection-optical system 51; similarly, the positions 63b, 63d are located on the line 65 and separated by respective distances BL from the center 61 of the projection-optical system 51.

Whenever an exposure operation is being conducted, the respective distances BL (termed "base lines") between the center 61 of the exposure-image field and any of the detection centers 63a, 63b, 63c, 63d are measured in advance. As the position of a mark on the wafer 54 is being measured by the mark-position-detection system 56, the coordinates of a position on a wafer at which exposure is to be performed are determined from the base line BL and from the relationship of a previously determined mark position and the position on the wafer at which an exposure is to be made. The wafer stage 55 is moved as required to place the coordinates, at which exposure is to be made, coincident with the center 61 of the exposure-image field 62. Thus, the exposure-image field 62 is positioned at the desired position on the wafer 54 to achieve projection of an image at the desired location on the wafer surface.

Recently, with relentless demand for increasingly higher integration, smaller miniaturization, and greater performance of microelectronic circuits, correspondingly greater resolution has been demanded of projection-exposure apparatus. In general, the resolving power W of a projection-exposure apparatus is a function of exposure wavelength $\lambda$ and the numerical aperture NA of the projection-optical ("imaging-optical") system. The relationship is expressed as follows:

$$W = k_1 \lambda / NA$$

where $k_1$ is a constant. According to this expression, improved resolution can be achieved by decreasing the wavelength of the exposure light and/or by increasing the numerical aperture. By way of example, in conventional projection-exposure apparatus that utilize i-line light ($\lambda$=365 nm), a resolution of 0.5 $\mu$m can be obtained with an imaging-optical system having an NA of approximately 0.5. Since it is difficult to fabricate imaging-optical systems having NA>0.5, the primary thrust in the effort to achieve better resolution has been toward shortening the wavelength of the exposure light. In this regard, exposure apparatus have been developed that utilize excimer-laser light. For example, a KrF excimer laser produces deep-UV light of wavelength 248 nm, and an ArF excimer laser produces deep-UV light of wavelength 193 nm. Based on these data, a resolution of 0.25 $\mu$m or less is expected from the use of KrF excimer laser light for exposure, and a resolution of 0.18 $\mu$m or less is expected from use of ArF excimer laser light for exposure. Even shorter wavelengths have been investigated. For example, X-ray light having a wavelength of 13 nm has been used as exposure light, yielding a resolution of 0.1 $\mu$m or less.

With respect to X-ray projection-exposure apparatus, no known lens materials exhibit adequate transmissivity to the X-ray light. Consequently, all the optical elements in imaging-optical systems in such apparatus must be reflective (mirrors) rather than refractive (lenses). Unfortunately, it is very difficult to design a reflective optical system having a wide on-axis optical field that produces imaging of acceptable quality for microlithography. As a result, multiple exposures of respective portions of a pattern are made to complete exposure of a complete pattern for a layer of the device. For consistent imaging quality, the exposure-image field can be formed off-axis (such a system is termed an "off-axis" optical system), wherein the image is formed in, e.g., a ring-shaped or annular field in which very high image resolution can be obtained due to excellent correction of aberrations. Using such an optical system, an image of a complete pattern for a circuit layer can be formed on the wafer by scanning the mask and wafer. Scanning exposure enables, for example, exposure of a die having dimensions of 20-mm square or larger using an imaging-optical system of which the exposure-image field is substantially smaller. Using this approach, acceptable X-ray imaging over a wide area can be achieved.

Figure 7:
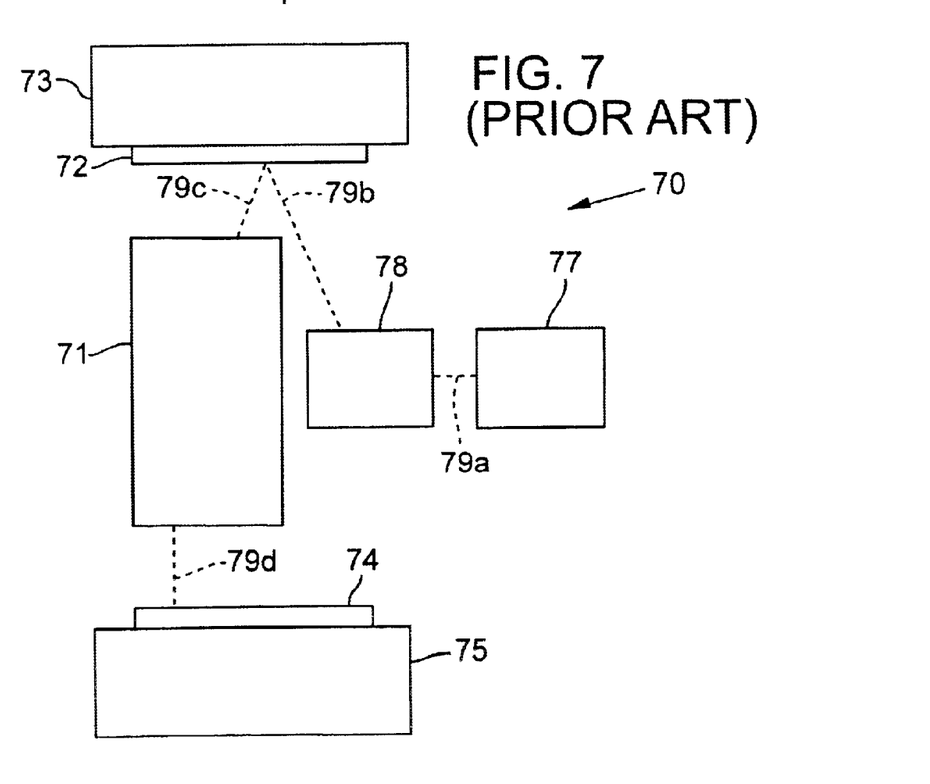
FIG. 7 is a conceptual diagram that elevationally depicts a conventional X-ray projection-exposure apparatus.

FIG. 7 is a conceptual view of a conventional X-ray projection-exposure apparatus 70. The major components of the apparatus 70 are a source 77 of an illumination beam 79a, an illumination-optical system 78 that receives the beam 79a and directs a corresponding X-ray beam 79b toward a mask 72, a mask stage 73, a projection-optical system 71 that receives the beam 79c reflected from the mask 72 and directs a corresponding imaging beam 79d toward a wafer 74, and a wafer stage 75.

The source 77 can be any suitable source of X-ray light, such as a discharge-plasma X-ray source. The illumination-optical system 78 comprises multiple reflective optical elements (mirrors) and filters as required to form the illumination beam 79b as a "hollow beam" having an annular transverse section, thereby configuring the beam for a ring-shaped illumination field on the mask 72.

The projection-optical system 71 comprises multiple reflective mirrors and the like as required to form an image of the portion of the mask 72 illuminated by the illumination beam 79b. So as to have high reflectivity to incident X-ray light, the mask 72 and mirrors of the projection-optical system 71 each have a multilayer-film coating on their respective reflective surfaces. The projection-optical system 71 retains the general shape of the illumination field and forms a corresponding image, via the beam 79d, on the surface of the wafer 74. I.e., the projection-optical system 71 has a ring-shaped exposure-imaging field that transfers to the wafer 74 the respective pattern portion defined in the corresponding ring-shaped illuminated area of the mask 72.

As noted above, the mask 72 is reflective and defines its respective circuit pattern on a multilayer-film reflective surface of the mask. Since the mask 72 is reflective, the projection-optical system 71 is non-telecentric on the mask side.

Since X-rays of wavelength ranging from 1 to 30 nm are greatly attenuated by the atmosphere, at least the propagation paths of the X-ray beam in the system of FIG. 7 must be maintained, during actual operation, in a subatmospheric-pressure (more specifically, high vacuum) environment or, alternatively, a helium environment. High vacuum is the more common and more preferred. As a result, the portion of the apparatus between the source 77 and the wafer 74 typically is contained in a vacuum chamber (not shown).

As noted above, micro-electronic devices typically are formed as multiple patterned layers formed superposedly relative to each other so as to interconnect three-dimensional dimensionally with each other. As a result, during microlithography performed using an X-ray projection-exposure apparatus 70, each subsequently applied layer is formed so as to overlay and register with the previously formed layer. To perform this overlay-exposure with high accuracy, it is necessary to include with the apparatus 70 devices capable of accurately and precisely detecting the position of the mask 72 and wafer 74 relative to each other during exposure. A typical device includes an interferometer and a mark-position-detecting system (not shown). The respective interferometers determine the position of the mask stage 73 and the position of the wafer stage 75 in real time. The respective mark-position-detecting systems detect respective marks formed on the wafer 74 and on the mask 72. Detection is usually performed optically.

Also, during transfer of a pattern onto the wafer surface, the images of the pattern elements must be formed at the desired locations on the wafer 74. In microlithography in general, the positional accuracy with which pattern elements are formed desirably is less than the minimum line-width of the pattern. The positional accuracy typically is no greater than approximately ¼ the minimum line-width of the pattern. Consequently, along with improving the resolving power of the projection-exposure apparatus 70 by using X-rays instead of deep-UV light, the positional accuracy with which pattern elements are formed on the wafer 74 by X-ray lithography also must be improved relative to the performance levels achieved with deep-UV lithography. Similar improvements also are needed in overlay accuracy achieved by X-ray microlithography compared to deep-UV microlithography.

To realize improvements in overlay accuracy, corresponding improvements are required in the accuracy with which the respective positions of alignment marks on the mask 72 and wafer 74 are detected. Similar improvements also are required in the accuracy with which the wafer stage 75 is actuated and in the stability of the base line BL (FIG. 6). Base-line stability pertains to the degree to which the base line, from the center of the exposure-image field 62 to the axis of the mark-position-detection system, remains constant in position during a defined time period, e.g., from the time of position measurement to the moment of making an exposure. If the base line becomes unstable, then the exposure position cannot be aligned reliably at the desired location on the wafer, which results in overlay error. Exemplary factors causing base-line variation include deformations of the optical column of the projection-optical system 71 and deformations of structural members supporting the optical column. Consequently, base-line stability may be influenced by lens-column stability, the stability of the mark-position-detection system, the stability of the structural members supporting the optical column and mark-position-detection system, and the length of the base line BL.

With respect to base-line length, a typical sequence of events is: (a) detection of mark position, (b) positional and orientational alignment of the wafer and mask, and (c) actual exposure, in which the wafer stage is moved along the base line from a position at which an alignment mark is detected to an actual exposure position. Hence, a long base line (i.e., a long distance between the mark-detection position and the center of the exposure-image field) results in a correspondingly long distance over which the wafer stage must be driven. Having to move the wafer stage over such a distance degrades the positional accuracy of the stage, with corresponding adverse effects on overlay accuracy.

With conventional X-ray projection-exposure apparatus, it is difficult from a practical standpoint to achieve a sufficiently high base-line stability for obtaining sufficiently accurate overlaying of layers, despite the greater resolving power of X-ray lithography. As a result, conventional X-ray lithography has not produced the desired yield of high-quality micro-electronic devices.

SUMMARY

Methods and apparatus as disclosed below address the shortcomings of conventional methods and apparatus as summarized above. One object is to provide X-ray projection-exposure (microlithography) apparatus capable of achieving a desired high overlay accuracy of fine circuit patterns.

According to a first aspect, X-ray projection-exposure apparatus are provided. An embodiment of such an apparatus comprises an X-ray source, an X-ray illumination-optical system, a mask stage for holding the mask, an X-ray projection-optical system, a wafer stage for holding the wafer, and a mark-position-detection system. The source produces an X-ray illumination beam. The illumination-optical system receives the illumination beam from the X-ray source and directs the illumination beam onto a pattern-defining mask, wherein X-ray light reflected from an illuminated patterned area on the mask is a "patterned beam." The projection-optical system receives and directs the patterned beam so as to form an image on a resist-coated wafer of the illuminated patterned area. The projection-optical system comprises a respective optical column having a center axis, a radius (R) relative to the center axis, and an exposure-image field that is situated off-axis relative to the center axis. The mark-position-detection system detects a position of a mark defined on either the wafer or wafer stage. The mark-position-detection system comprises a respective optical column having a radius (r) and a detection center that is displaced from the center axis of the projection-optical system by a distance greater than (R+r).

The mark-position-detection system can be configured to irradiate, on the mark, detection light that is visible, infrared, or ultraviolet (or a mixture of these) and detects detection light that is reflected, scattered, and/or diffracted from the mark.

The mark-position-detection system can comprise: (a) an optical system having a focal position, and (b) a device for changing the focal position in response to a change in refractive index between the optical system and the mark.

Another embodiment of an X-ray projection-exposure apparatus comprises an X-ray source, an X-ray illumination-optical system, a mask stage, an X-ray projection-optical system, a wafer stage, and a mark-position-detection system as summarized above. In addition, with respect to an x-y coordinate system (defined on the image plane by x- and y-axes having an origin at a point of intersection of the center axis with the image plane), the center of the exposure-image field is situated in a region (x<0), and the detection center is situated in a region (x≦0) and is displaced from the center axis of the projection-optical system by a distance greater than (R+r). Again, the detection center can be situated either on the x-axis or on a line, parallel to the y-axis, passing through the center of the exposure-image field. In addition, the mark-position-detection system can be configured to irradiate, on the mark, detection light that is visible, infrared, and/or ultraviolet and detects detection light that is reflected, scattered, and/or diffracted from the mark. Furthermore, the mark-position-detection system can comprise: (a) an optical system having a focal position, and (b) a device for changing the focal position in response to a change in refractive index between the optical system and the mark.

According to another aspect, methods are provided for performing X-ray projection-exposure of a pattern, defined by a mask held on a mask stage, onto a wafer held on a wafer stage. In an embodiment of such a method, a beam of X-rays from an X-ray source is irradiated onto a patterned region of the mask to form a patterned beam carrying an image of the irradiated region of the mask. Using an X-ray projection-optical system having a center axis and an image plane, and of which a respective optical column has a radius (R), the image is projected onto an exposure-image field in the image plane on a resist-coated wafer such that the exposure-image field is displaced laterally from the center axis. Using a mark-position-detection system of which a respective optical column has a radius (r), the position of a mark, defined either on the wafer or on the wafer stage, is detected at a detection center of the mark-position-detection system. The detection center is displaced from the center axis by a distance greater than (R+r). In response to a detection signal produced by the mark-position-detection system, the wafer stage is driven so as to form a projection image of the pattern at a desired location on the resist-coated wafer.

In the method summarized above, with respect to an x-y coordinate system defined on the image plane by x- and y-axes having an origin at a point of intersection of the center axis with the image plane, the center of the exposure-image field can be situated in a region (x<0) and situating the detection center in a region (x≦0).

The method further can comprise the steps of measuring a distance between the origin of the x-y coordinate system and the center of the exposure-image field, and driving the wafer stage a distance determined from the measured distance.

The detection center can be situated either on the x-axis or on a line, parallel to the y-axis, passing through the center of the exposure-image field.

The foregoing and additional features and advantages of the invention will be more readily apparent from the following detailed description, which proceeds with reference to the drawings.

DETAILED DESCRIPTION

Figure 1:
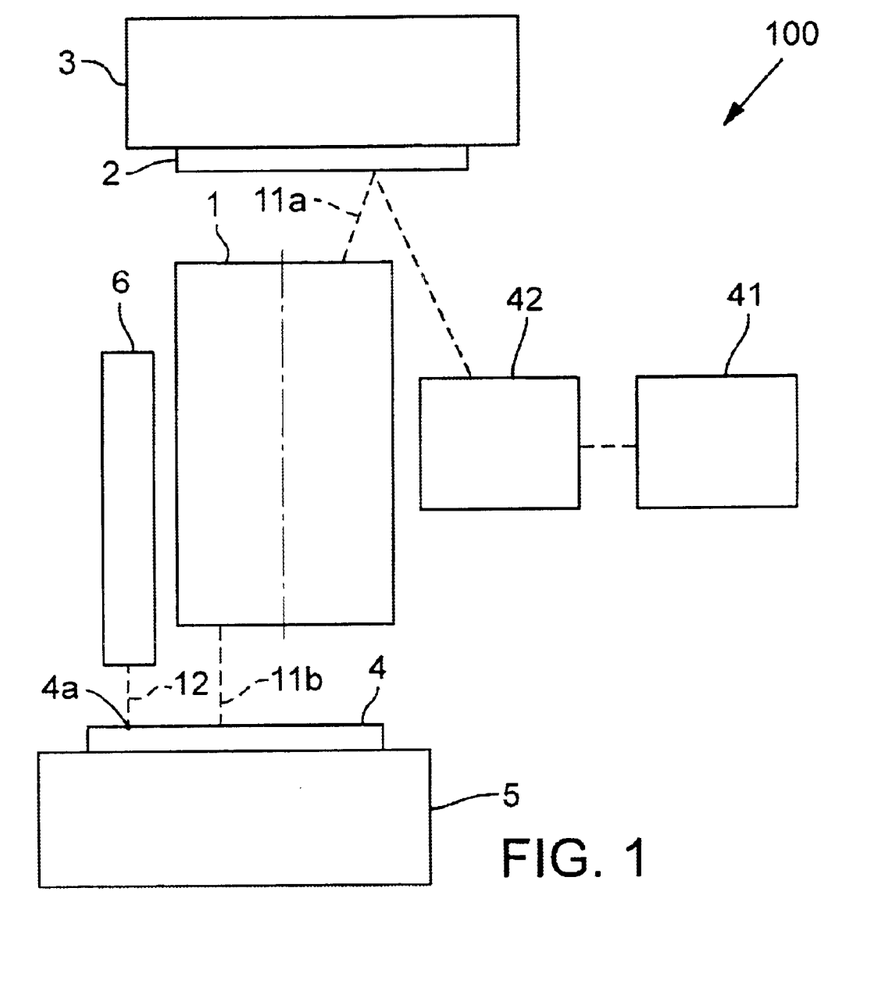
FIG. 1 is an elevational schematic diagram of an X-ray projection-exposure apparatus according to a representative embodiment.

Reference is made first to FIG. 1, which schematically depicts a first representative embodiment of an X-ray projection-exposure apparatus 100. The depicted apparatus 100 comprises a source 41 of X-ray light, an illumination-optical system 42 situated downstream of the source 41 so as to direct the X-ray beam (dashed line) from the source 41 to a mask 2, a mask stage 3 for holding the mask 2, a projection-optical system 1 situated so as to receive a beam 11a of patterned X-ray light reflected from the mask 2 and to direct the patterned beam 11b to a wafer 4, a wafer stage 5 for holding the wafer 4, a mark-position-detection system 6 associated with the wafer 4, and a mark-position-detection system (not shown, but similar to the system 6) associated with the mask 2.

The X-ray source 41 can be, for example, a discharge-plasma X-ray source. The illumination-optical system 42 comprises multiple lenses, filters, and the like for forming the beam from the source 41 into a hollow beam that is directed to the mask 2. The mask 2 is a reflective mask including a multilayer-film reflective surface on which a pattern is defined. The pattern defined on the mask 2 is intended for pattern transfer (e.g., at unitary magnification or demagnification) onto the wafer 4. The projection-optical system 1 has a ring-shaped exposure-image field, and comprises multiple multilayer-film reflective mirrors and the like. Since the mask 2 is reflective, the projection-optical system 1 is non-telecentric on the mask side. The illuminated portion of the mask pattern is focused onto a corresponding location on the surface of the wafer 4 by the projection-optical system 1. Meanwhile, as both the mask 2 and wafer 4 are scanned synchronously at a constant velocity, a pattern area of the mask 2 is illuminated selectively so as to be exposed on (transferred to) the surface of the wafer 4.

Since X-rays having a wavelength in the range of 1 to 30 nm are heavily attenuated by the atmosphere, at least the X-ray trajectories of the FIG. 1 apparatus are maintained at subatmospheric pressure (notably high vacuum) or in a suitable He atmosphere. (Most desirably, the atmosphere is high vacuum, as established in a vacuum chamber (not shown) containing the X-ray optical system.)

The mark-position-detection system 6 is situated and configured to detect a position of a mark (not shown) on the wafer stage 5 or a mark 4a on the wafer 4. The mark-position-detection system 6 includes an optical system that directs and utilizes a light beam 12 for mark detection.

Based upon data, obtained by the mark-position-detection system 6, concerning the position of the wafer 4, a wafer coordinate is obtained for use in driving the wafer stage 5, thereby ensuring that the mask pattern is exposed onto the desired location on the wafer.

Figure 2:
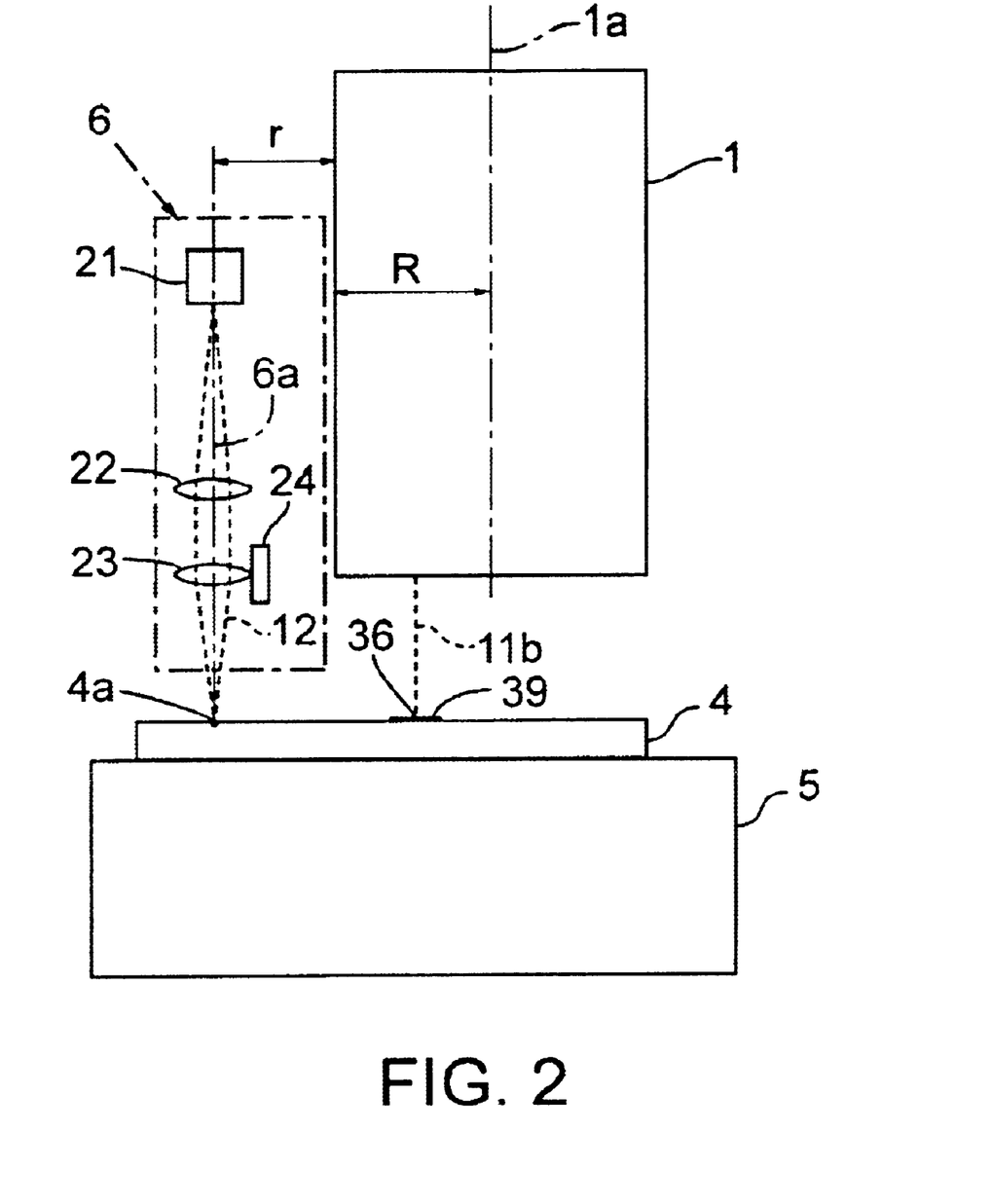
FIG. 2 depicts certain optical details of a mark-position-detection system as usable in the apparatus of FIG. 1.

FIG. 2 depicts certain details of an embodiment of the mark-position-detection system 6. Specifically, this embodiment is configured as an optical microscope. The wafer stage 5 is positioned such that the wafer mark 4a is located just downstream of the optical axis 6a of the mark-position-detection system 6. The point of intersection of the optical axis 6a with the surface of the wafer 4 is termed the "detection center." The system 6 includes a detector 21, such as a charge-coupled device (CCD) for detecting an enlarged image of the mark 4a. Upon detection of the mark 4a, the actual position of the mark is determined by execution of an image-processing routine. The mark-position-detection system 6 also comprises a light source (not shown), an illumination-optical system (not shown), and a detection-optical system (comprising lenses 22, 23). The light source produces a beam of light having a wavelength to which the photoresist on the wafer surface is not lithographically sensitive. The illumination-optical system of the system 6 directs the beam of light from the source onto the mark 4a as the lenses 22, 23 of the detection-optical system project an enlarged image of the illuminated mark onto the detector 21. The detection-optical system has a numerical aperture sufficiently large to form the mark image with high contrast, thereby allowing the position of the mark 4a to be detected with high accuracy and precision. The mark-position-detection system 6 also comprises a position-adjusting device 24, discussed later below.

Figure 3:
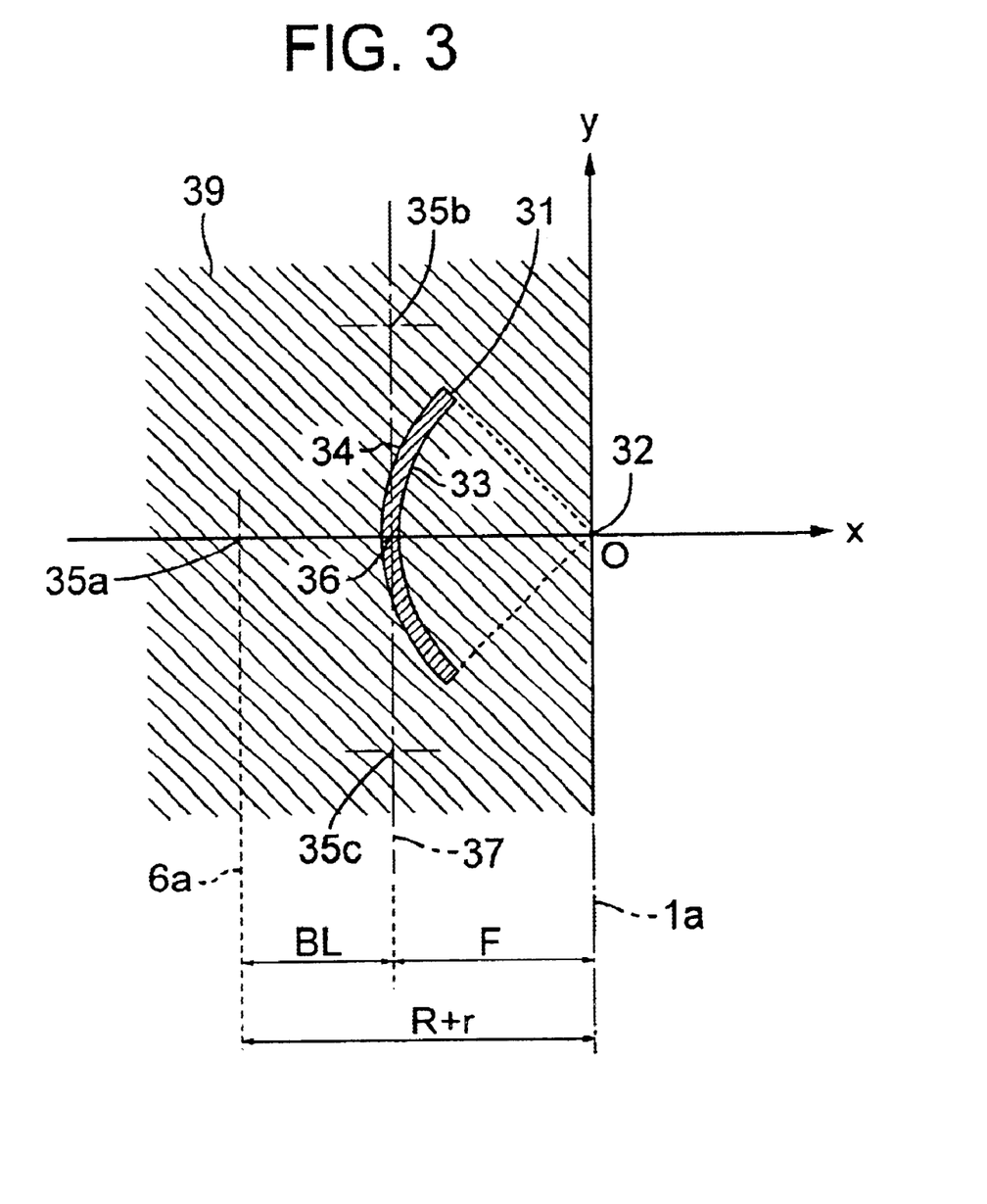
FIG. 3 depicts, in plan view, certain positional relationships between an exposure-image field and the "detection center" of a mark-position-detection system as usable in the apparatus of FIG. 1.

FIG. 3, providing a plan view as viewed from above, depicts positional relationships of the exposure-image field 31 of the projection-optical system 1 with the detection centers of the mark-position-detection system 6 in the embodiment of FIG. 1. In FIG. 3 the exposure-image field 31 is shaped as a sector of an annulus (ring) formed in the image plane of the projection-optical system 1. The exposure-image field 31 encompasses an area situated between two arcs 33, 34. The arcs 33, 34 have respective radii and subtend a certain angle centered at a cross-point 32 situated at the intersection of the center axis (which may or may not be the optical axis) of the projection-optical system 1 with the image plane (an x-y plane) of the projection-optical system. The sector-shaped exposure-image field 31 solves the difficulty of having to provide a wide image field in the vicinity of the center axis of a reflective optical system.

The detection center (e.g., point 35a, see FIG. 3) of the mark-position-detection system 6 for the wafer is laterally displaced, as shown in FIG. 2, a predetermined distance from the center axis 1a of the projection-optical system 1. The predetermined distance reflects space limitations caused by mechanical interference between the mark-position-detection system 6 and the projection-optical system 1. Normally, the mark-position-detection system 6 is mounted on the side wall of the optical column of the projection-optical system 1. The distance between the center axis 6a (corresponding to the detection center) of the mark-position-detection system 6 and the center axis 1a of the projection-optical system 1 is equal or nearly equal to the sum of the radius r (e.g., 50 mm) of the optical column of the mark-position-detection system 6 plus the radius R (e.g., 300 mm) of the optical column of the projection-optical system 1.

As indicated in FIG. 3, regarding the cross-point 32 as an origin, an x-y coordinate system is established such that the center 36 of the exposure-image field 31 is located at a position x on the x-axis, wherein x<0, and the detection center 35a of the mark-position-detection system 6 is located within a region denoted by $x \leq 0$ (namely, the area 39 denoted by hatching).

In other words, establishing a line connecting the cross-point 32 (corresponding to the center axis of the projection-optical system 1 and serving as an origin) with the center 36 of the exposure-image field 31 as an x-axis, the x-coordinate of the center 36 is at a respective −x value, relative to the cross-point 32. Similarly, the detection center 35a also has a respective −x coordinate. Thus, the detection center 35a is located in the −X-direction relative to the exposure-image field 31 and relative to the center axis 1a of the projection-optical system 1. This x-axis is parallel to or coincident with the axis along which the wafer stage 5 is moved during scanning exposure.

By situating the detection center 35 in the area 39 as discussed above, the base line BL (namely, the distance between the detection center 35 and the center 36 of the exposure-image field) can be made shorter than conventionally. As a result, the distance over which the wafer stage 5 is moved from the alignment position to the exposure position can be reduced, thereby correspondingly improving the stability of the base line. More specifically, and by way of example, whenever the detection center is situated at the point 35a on the x-axis, the stability of the base line is improved.

Similarly, by situating the detection center at a point 35b or a point 35c on a straight line (namely, a line extending parallel to the y-axis) passing through the center 36 of the exposure-image field, coordinates are established in a similarly simple manner that improves the stability of the base line.

The mark-position-detection system 6 cannot be located, even within the hatched area 39, where it may interfere with the optical column of the projection-optical system 1. However, the mark-position-detection system 6 desirably is located at a position separated from the cross-point 32 by a distance greater than (R+r) (FIG. 2) (namely, the radius of the optical column of the projection-optical system plus the radius of the mark-position-detection system). The shortest length of the base line BL is such a case is established when the detection center 35a is located on the x-axis (FIG. 3). A dimension of the base line BL in this case is obtained by subtracting a distance F (between the origin 32 and the center 36 of the exposure-image field) from the sum (R+r).

Whereas visible light, infrared light, or ultraviolet light can be irradiated as detection light onto the mark 4a on the wafer 4, the mark-position-detection system 6 can be configured to detect detection light reflected, scattered, and/or diffracted from the mark and having a wavelength in any of these ranges. By employing an optical detection principle, higher detection accuracy is obtained. In particular, by increasing the wavelength band of the detection light, a decreased interference effect of light within the resist on the wafer 4 is achieved, which improves detection accuracy.

Especially in embodiments in which the mark-position-detection system 6 is situated adjacent the projection-optical system 1, at least a portion of its optical system can be situated within the vacuum environment used for making microlithographic exposures. As a result, the optical elements of the optical system (which have refractive indices typical of glass) have refractive indices that are relative to the refractive index of vacuum, which is a desirable refractive-index difference for achieving high-resolution detection of mark position.

On the other hand, if any portion of the optical system of the mark-position-detection system 6 is situated at atmospheric pressure, then that portion can be adjusted easily without having to manipulate or release the vacuum established in the vacuum chamber. However, optical systems designed to exhibit an optimal degree of aberration correction under vacuum conditions usually do not exhibit optimal aberration correction under atmospheric-pressure conditions. For example, changing the pressure from vacuum to atmospheric or vice versa typically produces a change in focal length. Hence, it is desirable that the optical system of the mark-position-detection system 6 include a mechanism for correcting focal position. Providing a focal-position-correction mechanism allows accurate detection of mark position even under atmospheric conditions and allows easy adjustment of the mark-position-detection system 6.

An embodiment of a mark-position-detection system 6 including a focal-point-correction mechanism as described above includes an optical system comprising multiple lenses. A subset (one or more) of the lenses is movable by the focal-point-correction mechanism along the optical axis of the optical system. All the lenses of the optical system can be located in the vacuum chamber so as to be in the vacuum environment during use. Alternatively, a subset of the optical elements can be situated within the vacuum chamber while another subset of the optical elements is situated outside the vacuum chamber. The more desirable configuration has all the optical elements located in the vacuum environment, as shown in FIG. 2, in which a position-adjusting device 24 (e.g., an actuator such as a motor that moves at least one lens and thus, in combination with the at least one lens, serves as the focal-point-correction mechanism) is associated with at least one of the optical elements in the vacuum environment and is configured so as to adjust the lens 23 as required for optimal resolution of mark detection. The position-adjusting device 24 can be remote-controlled. Alternatively, the position-adjusting device 24 can be situated outside the vacuum chamber, which may be desirable because of the typically lower cost of such an arrangement.

The mark-position-detection system 6 is not limited to having an optically based detection system (i.e., an optical system based on visible, IR, or UV light). Alternative embodiments can utilize an electron beam or other charged particle beam, or an X-ray beam irradiated onto a mark. The mark-position-detection system 6, in such alternative embodiments, detects electrons, charged particles, or X-rays, respectively, that are reflected, scattered, or discharged energetically from the mark 4a, or that pass through the mark. If the projection-exposure apparatus utilizes an X-ray beam for exposure, the exposure environment is typically a high vacuum, which is an ideal environment for the electron beam, charged particle beam, or X-ray beam of the mark-position-detection system 6 (because all these types of beams are readily absorbed and attenuated by air).

Figure 4:
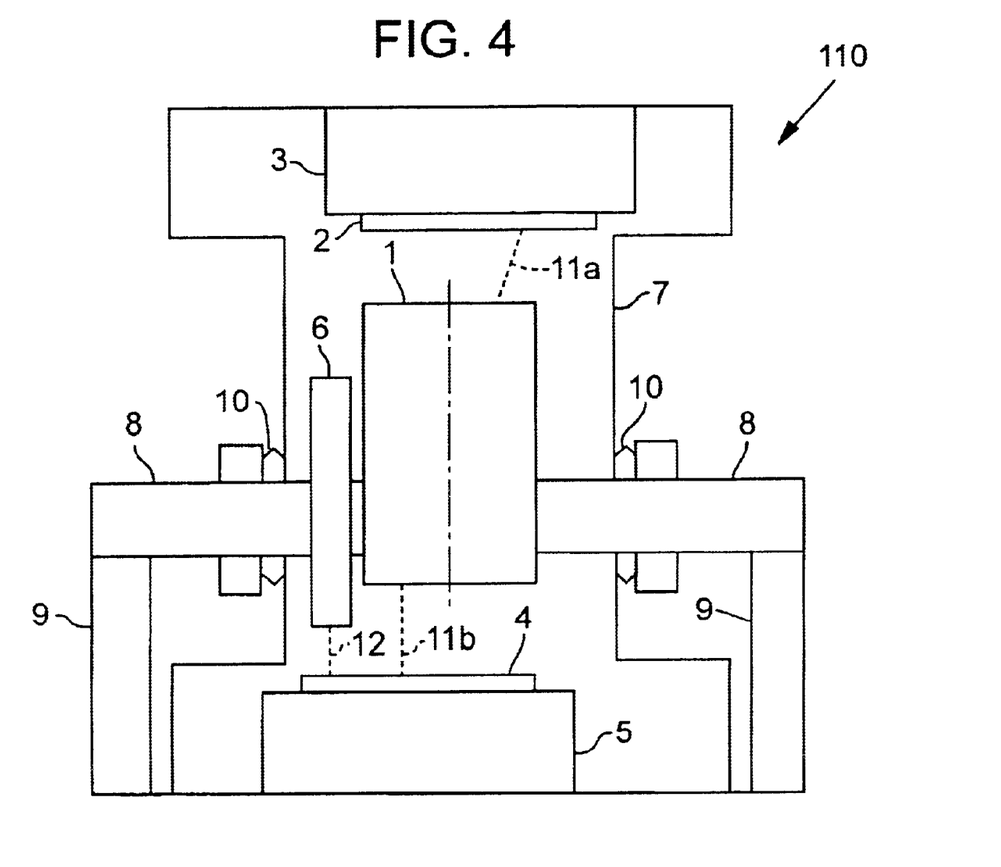
FIG. 4 is an elevational schematic diagram of an X-ray projection-exposure apparatus according to a second representative embodiment.

FIG. 4 depicts an X-ray projection-exposure apparatus 110 corresponding to a second representative embodiment. The apparatus 110 includes an X-ray source (not shown), an X-ray illumination-optical system (not shown), an X-ray projection-optical system 1, a mask stage 3 for holding a mask 2, a wafer stage 5 for holding a wafer 4, a mark-position-detection system 6 associated with the wafer 4, a mark-position-detection system (not shown) associated with the mask 2, a vacuum chamber 7, a base member 8 for supporting an optical column, and a vibration-damping base 9 for supporting the base member 8.

The X-ray light source in this embodiment is a laser-plasma X-ray source. X-rays generated by this are irradiated via the illumination-optical system onto the mask 2. An exemplary X-ray wavelength produced by the source is 13.5 nm, which requires that the mask 2 be an X-ray-reflective mask. The X-ray beam 11a reflected from the mask 2 pass through the projection-optical system 1 and, now as the beam 11b, is projected onto the wafer 4. By way of example, the mask pattern is transferred, with demagnification, onto the surface of the wafer 4. The projection-optical system 1 of this embodiment comprises six reflective mirrors, has a demagnification ratio of ¼, and has a ring-shaped exposure-image field having a width of 2 mm and a length of 30 mm. The six reflective mirrors are supported within an optical column made of Invar or analogous material to suppress thermal deformations of the projection-optical system 1. Each of the reflective mirrors has an aspherical reflective surface on which a respective Mo/Ru -Si multi-layer film has been applied so as to render the reflective surfaces highly reflective to incident X-rays. The Mo layers and Ru layers are formed alternatingly with respect to Si layers in a superposed manner and under conditions in which the internal stress exhibited by the multi-layer film desirably is no greater than 30 MPa.

During exposures, the mask 2 is moved in a scanning manner by the mask stage 3 as the wafer 4 is moved in a scanning manner by the wafer stage 5. If the projection-optical system 1 has a demagnification ratio of ¼, the scanning velocity of the wafer 4 is continuously synchronized at ¼ the scanning velocity of the mask 2.

The mark-position-detection system 6 associated with the wafer 4 is an optical microscope in this embodiment. The optical microscope forms an enlarged image of the mark 4a, formed on the wafer 4, and the enlarged image is detected by a CCD or the like of the mark-position-detection system 6. The mark image is digitally processed to obtain data concerning the position of the wafer 4.

As indicated in FIG. 3, a detection center of the mark-position-detection system 6 associated with the wafer can be situated at the point 35a on the x-axis. In this position, the mark image can be observed readily. The mark-position-detection system 6 also is arranged such that the base line BL (FIG. 3), between the center 36 of the exposure-image field and the detection center 35a, is minimized in length.

The mark-position-detection system 6 is mounted to the base member 8, which is mounted on the vibration-attenuating base 9. The vibration-attenuating base 9 is configured to prevent propagation of vibrations (e.g., from the mask stage 3 and/or wafer stage 5) to the base member 8 and hence to the projection-optical system 1 and the mark-position-detection 6. In addition, a shock-absorber 10 such as a bellows or the like is situated between the vacuum chamber 7 and the base member 8. Thus, the positional relationships of the projection-optical system 1 and the mark-position-detection system 6 relative to each other are maintained substantially constant, thereby allowing the position of a mark on the wafer to be detected to within 10 nm or less with high accuracy. Such accurate detection also provides a base-line stability of 10 nm or better.

With such accuracy in mark detection and stability of the base line achieved using the apparatus of FIG. 4, microlithographic exposures of fine patterns are performed with extremely good overlay accuracy. For example, the apparatus 110 can produce transferred patterns, in the resist on the wafer 4, having a minimum feature size of 0.07 $\mu$m over the entire die area (area of a single semiconductor chip as formed on the wafer) with good shape fidelity of the transferred pattern elements, at high yield and high throughput.

An exemplary exposure of a resist-coated wafer, using the apparatus of FIG. 4, is performed as follows. First, multiple marks formed on the surface of the wafer 4 are detected, in advance of exposure, by the mark-position-detection system 6. From these positional data, the respective intervals between the marks are determined and compared to respective as-designed data. Any differences from as-designed data serve as the bases for calculating respective magnification-correction data. The magnification-correction data are used to correct the positions of the mask 2 and/or wafer 4 (in the direction of the optical axis of the projection-optical system 1) during exposure so as to achieve optimal exposure at each location on the wafer.

Next, a baseline, corresponding to a distance between the center of an exposure-image field and a detection center, is measured.

In a similar manner, respective marks defined on the wafer surface and on the mask surface are detected by the respective mark-position-detection systems. As required, and based on data obtained by these systems, the wafer stage 5 and mask stage 3 are driven so as to adjust the wafer position relative to the mask position. Thus, on the wafer 4, a projected pattern is formed on the previously formed circuit pattern at a desired overlay accuracy, based on upon the previously obtained data concerning the base line. Thus, for example, a resist pattern having a minimum feature size of 0.07 µm or less can be obtained over the entire die area on the wafer, at an overlay accuracy of 10 nm or better.

The X-ray projection-exposure apparatus and methods described above can be used for manufacturing a microelectronic device. For example, the microelectronic device can be a 16-GB (gigabytes) DRAM. Typically, these devices comprise approximately 22 layers, of which at least 15 layers have sufficiently narrow linewidths to require exposure by X-ray projection-exposure. The remaining 7 layers have pattern linewidths of at least 0.15 µm, which allow them to be exposed by excimer-laser microlithography. The microlithography steps are accompanied by respective steps of resist-coating, doping, annealing, etching, and metal depositions, as required. Completing formation of all the requisite layers completes formation of the respective microelectronic devices on the wafer. The wafer is cut up ("diced") into individual "chips," and each chip is encased in a package of, e.g., ceramic.

As described above, X-ray projection-exposure apparatus as described above provide enhanced base-line stability. As a result, during microlithography performed using the apparatus, increased accuracy of layer overlay is obtained, even with wafers exhibiting large deformation. Such increased accuracy is realized without sacrificing throughput.

Whereas the invention has been described in connection with several representative embodiments, it will be understood that the invention is not limited to those embodiments. On the contrary, the invention is intended to encompass all modifications, alternatives, and equivalents as may be included within the spirit and scope of the appended claims.

What is claimed is:

1. An X-ray projection-exposure apparatus, comprising:
   an X-ray source that produces an X-ray illumination beam;
   an X-ray illumination-optical system that receives the illumination beam from the X-ray source and directs the illumination beam onto a pattern-defining mask, wherein X-ray light reflected from an illuminated patterned area on the mask is a patterned beam;
   a mask stage for holding the mask;
   an X-ray projection-optical system that receives and directs the patterned beam so as to form an image on a resist-coated wafer of the illuminated patterned area, the projection-optical system comprising a respective optical column having a center axis, a radius (R) relative to the center axis, and an exposure-image field that is situated off-axis relative to the center axis;
   a wafer stage for holding the wafer; and
   a mark-position-detection system for detecting a position of a mark defined on either the wafer or wafer stage, the mark-position-detection system comprising a respective optical column having a radius (r) and a detection center that is displaced from the center axis of the projection-optical system by a distance greater than (R+r).

2. The X-ray projection-exposure apparatus of claim 1, wherein the mark-position-detection system irradiates, on the mark, detection light that is visible, infrared, or ultraviolet and detects detection light that is reflected, scattered, or diffracted from the mark.

3. The X-ray projection-exposure apparatus of claim 1, wherein the mark-position-detection system comprises (i) an optical system having a focal position, and (ii) a device for changing the focal position in response to a change in refractive index between the optical system and the mark.

4. An X-ray projection-exposure apparatus, comprising:
   an X-ray source that produces an X-ray illumination beam;
   an X-ray illumination-optical system that receives the illumination beam from the X-ray source and directs the illumination beam onto a pattern-defining mask, wherein X-ray light reflected from an illuminated patterned area on the mask is a patterned beam;
   a mask stage for holding the mask;
   an X-ray projection-optical system that receives and directs the patterned beam so as to form an image on a resist-coated wafer of the illuminated patterned area, the projection-optical system comprising a respective optical column having a center axis, a radius (R) relative to the center axis, and an exposure-image field having a center that is situated off-axis relative to the center axis on an image plane;
   a wafer stage for holding the wafer; and
   a mark-position-detection system for detecting a position of a mark defined on either the wafer or wafer stage, the mark-position-detection system comprising a respective optical column having a radius (r) and a detection center,
   wherein with respect to an x-y coordinate system, defined on the image plane by x- and y-axes having an origin at a point of intersection of the center axis with the image plane, the center of the exposure-image field is situated in a region (x<0), and the detection center is situated in a region (x≦0) and is displaced from the center axis of the projection-optical system by a distance greater than (R+r).

5. The X-ray projection-exposure apparatus of claim 4, wherein the detection center is situated either on the x-axis or on a line, parallel to the y-axis, passing through the center of the exposure-image field.

6. The X-ray projection-exposure apparatus of claim 4, wherein the mark-position-detection system irradiates, on the mark, detection light that is visible, infrared, or ultraviolet and detects detection light that is reflected, scattered, or diffracted from the mark.

7. The X-ray projection-exposure apparatus of claim 4, wherein the mark-position-detection system comprises (i) an optical system having a focal position, and (ii) a device for changing the focal position in response to a change in refractive index between the optical system and the mark.

8. A method for performing X-ray projection-exposure of a pattern, defined by a mask held on a mask stage, onto a wafer held on a wafer stage, the method comprising:

irradiating a beam of X-rays from an X-ray source onto a patterned region of the mask to form a patterned beam carrying an image of the irradiated region of the mask;

using an X-ray projection-optical system having a center axis and an image plane, and of which a respective optical column has a radius (R), projecting the image onto an exposure-image field in the image plane on a resist-coated wafer such that the exposure-image field is displaced laterally from the center axis;

using a mark-position-detection system of which a respective optical column has a radius (r), detecting a position of a mark, defined either on the wafer or on the wafer stage, at a detection center of the mark-position-detection system, the detection center being displaced from the center axis by a distance greater than (R+r); and in response to a detection signal produced by the mark-position-detection system, driving the wafer stage so as to form a projection image of the pattern at a desired location on the resist-coated wafer.

9. The method of claim 8, wherein, with respect to an x-y coordinate system defined on the image plane by x- and y-axes having an origin at a point of intersection of the center axis with the image plane, situating the center of the exposure-image field in a region (x<0) and situating the detection center in a region (x≦0).

10. The method of claim 9, further comprising:

measuring a distance between the origin of the x-y coordinate system and the center of the exposure-image field; and driving the wafer stage a distance determined from the measured distance.

11. The method of claim 9, wherein the detection center is situated either on the x-axis or on a line, parallel to the y-axis, passing through the center of the exposure-image field.

* * * * *

UNITED STATES PATENT AND TRADEMARK OFFICE
CERTIFICATE OF CORRECTION

PATENT NO.    : 6,816,568 B2                                        Page 1 of 1
DATED         : November 9, 2004
INVENTOR(S)   : Oshino It is certified that error appears in the above-identified patent and that said Letters Patent is hereby corrected as shown below:

Title page, Item [54] and Column 1, lines 1-3,
Title, should read -- X-RAY PROJECTION-EXPOSURE APPARATUS AND METHODS PROVIDING IMPROVED LAYER OVERLAY ACCURACY --.

Column 13,
Line 24, "based on upon" should read -- based upon --.

Signed and Sealed this

Tenth Day of May, 2005

JON W. DUDAS
*Director of the United States Patent and Trademark Office*